United States Patent
Yee et al.

(10) Patent No.: US 7,957,128 B2
(45) Date of Patent: Jun. 7, 2011

(54) ORGANIC LIGHT EMITTING DIODE DISPLAY

(75) Inventors: Dong-Su Yee, Yongin (KR); Kuen-Dong Ha, Yongin (KR); Hyun-Hee Lee, Yongin (KR); Chan-Kyoung Moon, Yongin (KR); Hyun-Min Hwang, Yongin (KR); Eun-Ah Kim, Yongin (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 122 days.

(21) Appl. No.: 12/352,058

(22) Filed: Jan. 12, 2009

(65) Prior Publication Data

US 2009/0195973 A1 Aug. 6, 2009

(30) Foreign Application Priority Data

Feb. 4, 2008 (KR) .................. 10-2008-0011138

(51) Int. Cl.
*H05K 5/00* (2006.01)
*H05K 7/00* (2006.01)
(52) U.S. Cl. ......... 361/679.21; 361/679.26; 361/679.55; 361/679.56
(58) Field of Classification Search ............. 361/679.21, 361/679.26, 679.55, 679.56
See application file for complete search history.

(56) References Cited

U.S. PATENT DOCUMENTS

| | | | |
|---|---|---|---|
| 6,055,029 | A | 4/2000 | Kurihara et al. |
| 7,292,290 | B2 * | 11/2007 | Miyagawa et al. ............. 349/58 |
| 2002/0167626 | A1 * | 11/2002 | Matsuda et al. ................ 349/65 |
| 2005/0184662 | A1 | 8/2005 | Cok et al. |
| 2006/0133018 | A1 * | 6/2006 | Okuda ......................... 361/681 |
| 2008/0007159 | A1 | 1/2008 | Seo et al. |

FOREIGN PATENT DOCUMENTS

| | | |
|---|---|---|
| EP | 1 655 128 | 5/2006 |
| KR | 2005-70543 | 7/2005 |
| KR | 2006-34044 | 4/2006 |
| KR | 2006-39658 | 5/2006 |
| KR | 10-729084 | 6/2007 |
| TW | 247552 | 1/2006 |
| WO | WO 2008/057143 | 5/2008 |

OTHER PUBLICATIONS

Communication issued by the European Patent Office on Apr. 8, 2009.

* cited by examiner

*Primary Examiner* — Jayprakash N Gandhi
*Assistant Examiner* — Anthony M Haughton
(74) *Attorney, Agent, or Firm* — Robert E. Bushnell, Esq.

(57) ABSTRACT

An OLED display including: a panel assembly having a display region, a pad region, and a plurality of OLEDs formed in the display region; a bezel disposed around, and spaced apart from the panel assembly; and a fixing member to fix the panel assembly to the bezel.

26 Claims, 9 Drawing Sheets

ORGANIC LIGHT EMITTING DIODE DISPLAY

CROSS-REFERENCE TO RELATED APPLICATIONS

This application claims the benefit of Korean Application No. 2008-11138, filed Feb. 4, 2008, in the Korean Intellectual Property Office, the disclosure of which is incorporated herein by reference.

BACKGROUND OF THE INVENTION

1. Field of the Invention

Aspects of the present disclosure relate to an organic light emitting diode (OLED) display. More particularly, aspects of the present disclosure relate to an OLED display having enhanced mechanical strength, due to an improved bezel that supports a panel assembly.

2. Description of the Related Art

An OLED display includes a plurality of OLEDs, each having a hole injection electrode, an organic emissive layer, and an electron injection electrode. The OLEDs emit light using energy generated when excitons, generated by electron-hole combinations in the organic light emitting layer, drop from an excitation state to a ground state.

By the above principle, OLED displays have a self-emissive characteristic. Therefore, unlike liquid crystal displays (LCDs), OLED displays do not require a separate light source, and thus, the thickness and weight thereof can be reduced. Further, OLED displays have low power consumption, high luminance, quick response, and the like. Therefore, OLED displays are drawing attention as the preferred displays for portable electronic devices.

Generally, a typical OLED display includes a panel assembly in which OLEDs are formed, a bezel coupled to the panel assembly, at a rear side of the panel assembly, and a printed circuit board (PCB) electrically connected to the panel assembly, by a flexible printed circuit board (FPCB). A panel assembly of an LCD includes two thin substrates, and liquid crystal filled in a space between these substrates. Unlike an LCD, an OLED display is designed such that spaces exist inside of the panel assembly. Therefore, the mechanical strength of an OLED may be compromised.

Therefore, when a user accidentally drops an electronic device having an OLED display, relatively large torsion loads and/or relatively large bending loads are applied to the bezel, and thus, the bezel is deformed. As a result, the torsion loads and/or the bending loads are transferred to the panel assembly, which is coupled to the bezel. This may cause damage to the panel assembly.

The above information is disclosed for enhancement of understanding of the background of the invention, and therefore, it may contain information that does not constitute prior art.

SUMMARY OF THE INVENTION

Exemplary embodiments of the present disclosure provide an OLED display having enhanced mechanical strength and impact resistance, due to an improved bezel, which is coupled to a panel assembly.

In an exemplary embodiment of the present disclosure, an organic light emitting diode (OLED) display includes: a panel assembly comprising a display region, a pad region, and a plurality of OLEDs formed in the display region; a bezel disposed around the panel assembly; and a fixing member to fix the panel assembly to the bezel.

In an exemplary embodiment of the present disclosure, the fixing member may be located on a rear surface of the panel assembly and a rear surface of the bezel. The fixing member may include a base layer, and an adhesive layer formed on a surface of the base layer, which faces the panel assembly and the bezel.

In an exemplary embodiment of the present disclosure, the bezel may include a pair of long side portions, between which an opening is defined, and a pair of short side portions, between which the opening is also defined. One of the short side portions, which corresponds to the pad region, is provided with a recess portion. The OLED display may further include: a flexible printed circuit board fixed on the pad region, and bent toward a rear surface of the fixing member, and enclosing the recess portion; and a printed circuit board electrically connected to the flexible printed circuit board.

In an exemplary embodiment of the present disclosure, the OLED display may include an impact absorption member located between the panel assembly and the fixing member. The impact absorption member may include an impact absorption layer formed of a sponge material or of urethane, and an adhesive layer formed on a surface of the impact absorption layer, facing the panel assembly.

In an exemplary embodiment of the present disclosure, a top surface of the bezel may be located horizontally, at a level equal to, or higher than, a top surface of the panel assembly. The width of the bezel may be greater than the thickness of the bezel. The bezel may be spaced apart from an outer perimeter of the panel assembly.

In an exemplary embodiment of the present disclosure, the OLED display may include a filler located between the panel assembly and the bezel. The bezel may be formed of one of stainless steel, cold drawn steel, aluminum, an aluminum alloy, a magnesium alloy, and a nickel alloy.

In an exemplary embodiment of the present disclosure, the fixing member may be located between the panel assembly and the bezel. The bezel may correspond to side surfaces of the panel assembly, except for a side surface corresponding to the pad region. The bezel may be formed of a synthetic resin.

In an exemplary embodiment of the present disclosure, a plurality of grooves may be formed on a front surface and a rear surface of the bezel, to partly reduce a thickness/weight of the bezel. Alternatively, a plurality of grooves may be formed on inner and outer side surfaces of the bezel, to partly reduce a width/weight of the bezel. Alternatively, a plurality of holes may be formed in the front surface and the rear surface of the bezel. Alternatively, a plurality of holes may be formed in inner and outer side surfaces of the bezel.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent, and more readily appreciated, from the following description of the exemplary embodiments, taken in conjunction with the accompanying drawings, of which.

DETAILED DESCRIPTION OF THE EXEMPLARY EMBODIMENTS

Figure 1:
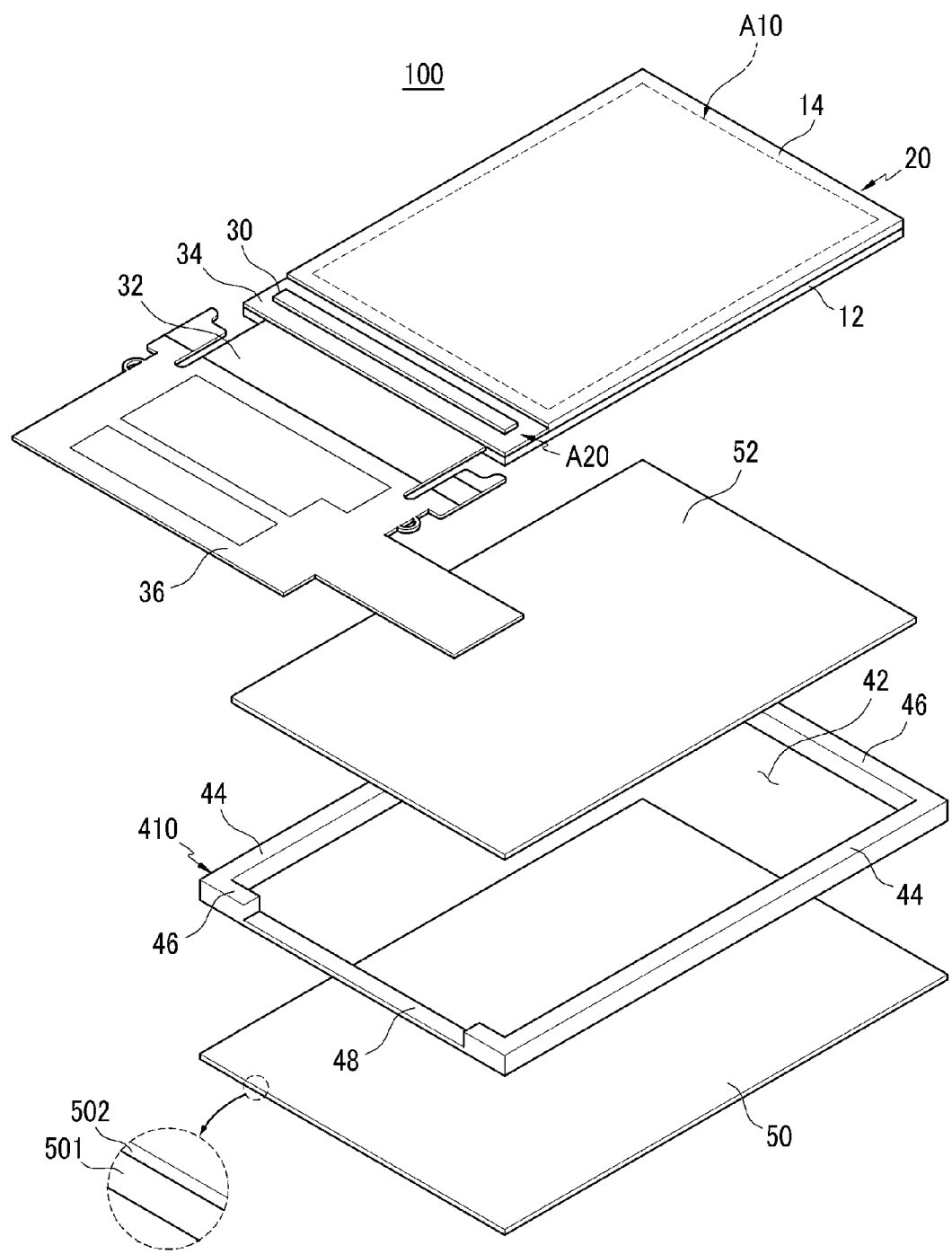
FIG. 1 is an exploded perspective view of an OLED display, according to a first exemplary embodiment of the present disclosure.

Reference will now be made in detail to the exemplary embodiments of the present invention, examples of which are illustrated in the accompanying drawings, wherein like reference numerals refer to the like elements throughout. The exemplary embodiments are described, below in order to explain the aspects of the present invention, by referring to the figures.

Figure 2:
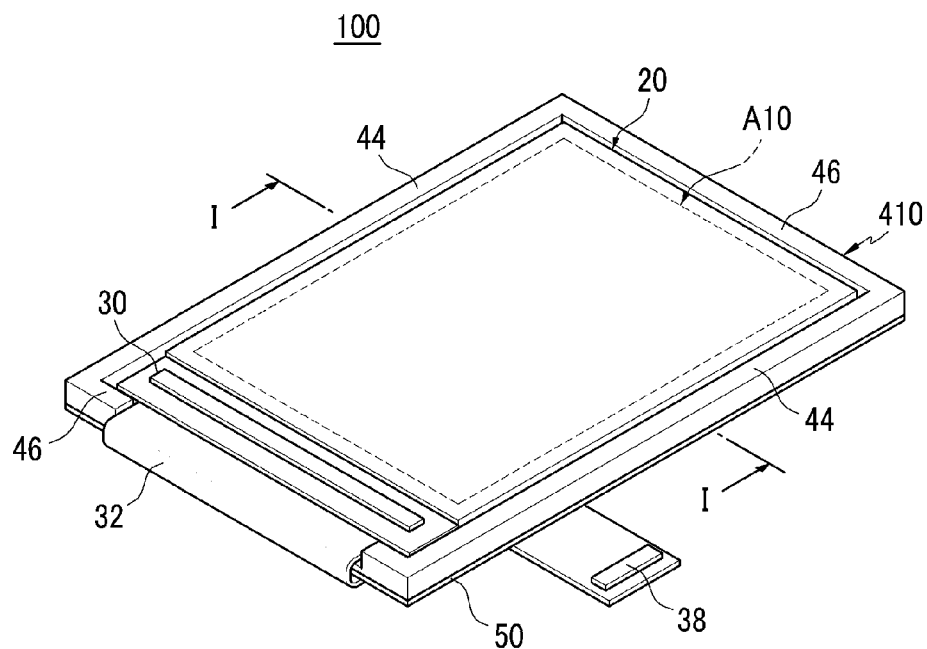
FIG. 2 is an assembled perspective view of the OLED display of FIG. 1.
Figure 3:
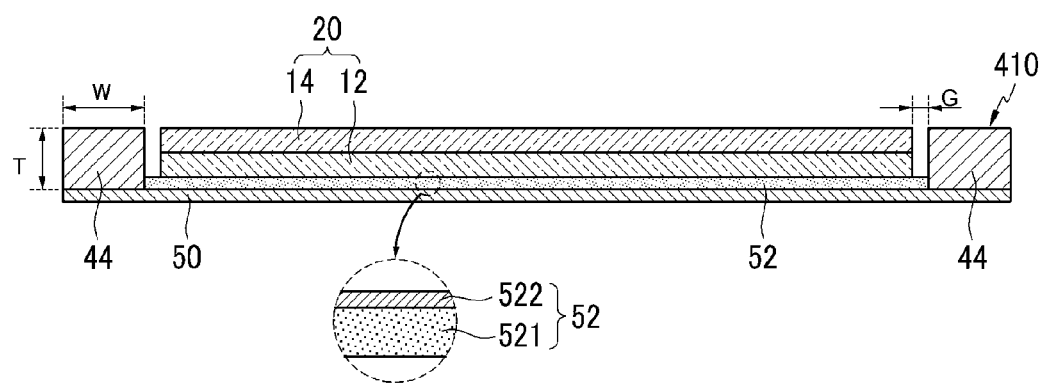
FIG. 3 is a cross-sectional view taken along line I-I of FIG. 2.

FIG. 1 is an exploded perspective view of an OLED display 100, according to a first exemplary embodiment of the present disclosure, FIG. 2 is an assembled perspective view of the OLED display 100, and FIG. 3 is a cross-sectional view taken along line I-I, of FIG. 2. Referring to FIGS. 1 to 3, the OLED display 100 includes: a panel assembly 20 having a display region A10 to display an image, and a pad region A20; a bezel 410 coupled to the panel assembly 20; and a printed circuit board (PCB) 36 electrically connected to the panel assembly 20, via a flexible printed circuit board (FPCB) 32.

The panel assembly 20 includes a first substrate 12 and a second substrate 14. The second substrate 14 is smaller than the first substrate 12, and has a peripheral portion coupled to the first substrate 12, by a sealant. The display region A10 is defined at an overlapping region of the first and second substrates 12 and 14. The display region A10 is surrounded by the sealant. The pad region A20 is disposed outside of the sealant.

A plurality of sub-pixels are disposed in a matrix pattern, in the display region A10 of the first substrate 12. Scan and data drivers (not shown) to drive the sub-pixels, are located between the display region A10 and the sealant, or outside of the sealant. Pad electrodes (not shown) transfer electric signals to the scan and data drivers, and are located in the pad region A20.

Figure 4:
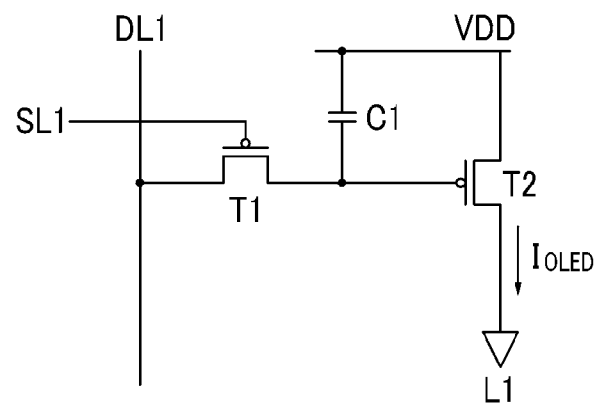
FIG. 4 is a circuit diagram of a sub-pixel circuit of a panel assembly depicted in FIG. 1.
Figure 5:
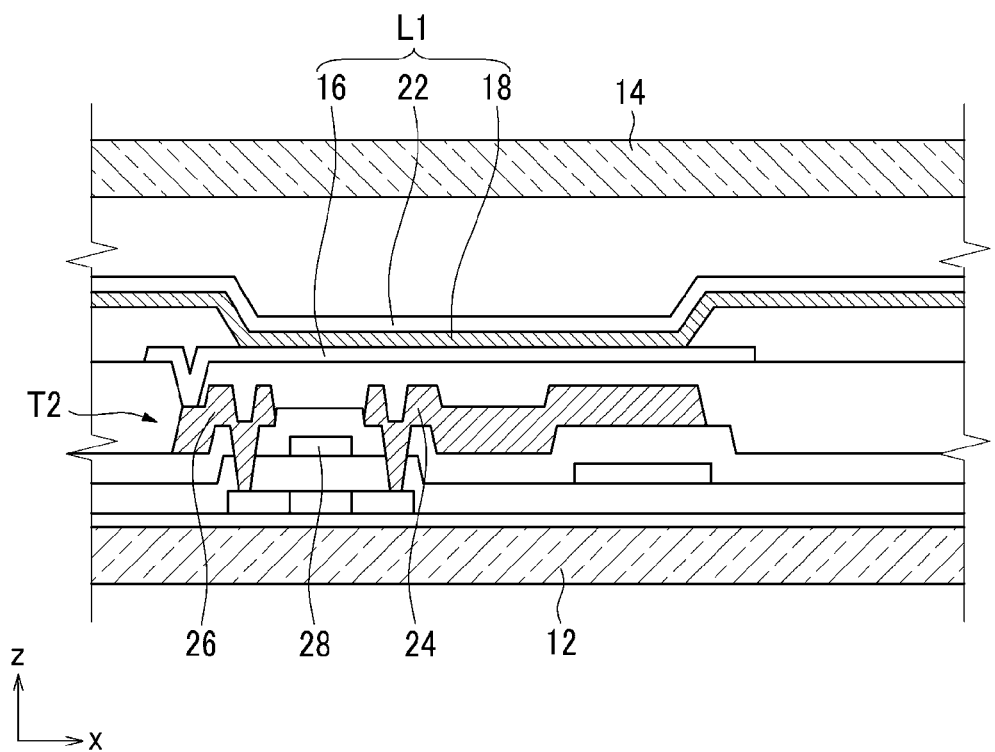
FIG. 5 is an enlarged cross-sectional view of a portion of the panel assembly depicted in FIG. 1.

FIG. 4 is a circuit diagram of a sub-pixel circuit of the panel assembly 20, and FIG. 5 is an enlarged cross-sectional view of a portion of the panel assembly 20. Referring to FIG. 4 and FIG. 5, each of the sub-pixels of the panel assembly 20 includes an OLED L1 and a driving circuit unit. The OLED L1 includes an anode electrode 16, an organic emissive layer 18, and a cathode electrode 22. The driving circuit unit includes at least two thin film transistors and at least one storage capacitor C1. The thin film transistors include at least one switching transistor T1 and at least one driving transistor T2.

The switching transistor T1 is connected to scan and data lines SL1 and DL1, to transfer a data voltage, which is an input from the data line DL1, in accordance with a switching voltage input to the scan line SL1, to the driving transistor T2. The storage capacitor C1 is connected to a power line VDD, as well as to the switching transistor T1, to store a voltage corresponding to a difference between a voltage transferred from the switching transistor T1, and a voltage supplied from the power line VDD.

The driving transistor T2 is connected to both the power line VDD and the storage capacity C1, to supply an output current $I_{OLED}$ to the OLED L1, which corresponds to a square of the difference between a voltage stored in the storage capacity C1, and a threshold voltage. The OLED L1 can emit light using the output current $I_{OLED}$. The driving transistor T2 includes a source electrode 24, a drain electrode 26, and a gate electrode 28. The anode electrode 16 is connected to the drain electrode 26. The above-described structure of the sub-pixels is exemplary only, and may be modified in various ways.

The second substrate 14 is coupled to the first substrate 12 by the sealant, at a predetermined interval, to protect the driving circuit unit and the OLEDs on the first substrate 12 from an external environment. A polarizing plate (not shown) to suppress reflections of external light, may be located on an outer surface of the second substrate 14, at the display region A10. A moisture absorption agent (not shown) may be attached on an inner surface of the second substrate 14.

Referring again to FIGS. 1 to 3, an integrated circuit chip 30 is mounted at the pad region A20 of the panel assembly 20, through a chip-on-glass (COG) method. The FPCB 32 is also mounted at the pad region A20, through a chip-on-film (COF) method. A protective layer 34 is formed around the integrated circuit chip 30 and the FPCB 32, to cover and protect pad electrodes formed at the pad region A20.

A variety of electronic elements (not shown) for processing driving signals are mounted on the PCB 36. A connector 38, to transfer external signals to the PCB 36, is also installed on the printed circuit board 36. In the present exemplary embodiment, the bezel 410 includes a pair of long side portions 44, between which an opening 42 is defined, and a pair of short side portions 46, between which the opening 42 is also defined. The panel assembly 20 is fitted in the opening 42, such that the bezel 410 is located around the perimeter of the panel assembly 20. That is, the bezel 410 is not provided with a bottom portion, on which the panel assembly 20 is disposed. Therefore, the perimeter of the panel assembly 20 is coupled to a rear surface of the bezel 410.

A fixing member 50, to fix the bezel 410 and the panel assembly 20, is disposed on rear surfaces of the panel assembly 20 and bezel 410. The fixing member 50 may be a single-sided adhesive tape, having a base layer 501 and an adhesive layer 502 formed on a surface of the base layer 501, which faces the panel assembly 20 and the bezel 410 (see FIG. 1). Therefore, the panel assembly 20 is fixed to a central portion of the fixing member 50, and the bezel 410 is fixed on a peripheral portion of the fixing member 50. As a result, the panel assembly 20 and the bezel 410 are coupled to each other, by the fixing member 50.

The FPCB 32, which is fixed at the pad region A20, is folded toward a rear surface of the fixing member 50, at one of the short side portions 46 of the bezel 410. One of the short side portions 46 is provided with a recess portion 48, through which the FPCB 32 passes. That is, a front surface of the recess portion 48 is lower than a front surface of the short side portions 46. Therefore, the FPCB 32 is bent toward the rear surface of the fixing member 50, while enclosing the short side portion 46 that includes the recess portion 48.

An impact absorption member 52 may be located between the panel assembly 20 and the fixing member 50, to absorb external impacts. The impact absorption member 52 includes an impact absorption layer 521 and an adhesive layer 522 formed on a surface of the impact absorption layer 521, which faces the panel assembly 20 (see FIG. 3). The impact absorption layer 521 may be formed of a sponge material or urethane. The impact absorption member 52 attenuates external impacts applied to the panel assembly 20, to protect the panel assembly 20.

The front surface of the bezel 410 may be located in the same plane as the front surface of the panel assembly 20, or may be located in front of the front surface of the panel assembly 20. As referred to herein, the front surface of the OLED display 100, and the various components thereof, relates to the surface upon which an image is displayed. That is, if the impact absorption member 52 is not provided, a thickness of the bezel 410 may be equal to, or greater than, that of the panel assembly 20. When the impact absorption member 52 is provided, the thickness of the bezel 410 may be equal to, or greater than, the sum of the thicknesses of the panel assembly 20 and the impact absorption member 52.

FIG. 3 shows an exemplary embodiment where a thickness T of the bezel 410 is the same as the sum of the thicknesses of the panel assembly 20 and the impact absorption member 52. If the front surface of the bezel 410 is lower than the front surface of the panel assembly 20, an impact load, which is generated when an external impact is applied to the OLED display 100, is directly transferred to the panel assembly 20. This may damage the panel assembly 20.

The outer perimeter (side surfaces) of the panel assembly 20 may be spaced apart from the inner wall (inner perimeter) of the bezel 410, by a gap G (see FIG. 3). Therefore, even when the bezel 410 is deformed by an external impact, the deformation of the bezel 410 does not directly affect the panel assembly 20. In order to enable the impact absorption member 52 to contact the bezel 410, the impact absorption member 52 may be formed to have a larger surface area than the panel assembly 20 (see FIG. 3).

In order to have a proper strength, the bezel 410 is designed to have a width W that is greater than the thickness T (see FIG. 3). If the width W of the bezel 410 is less than the thickness T, the bezel 410 may not have a sufficient resistance to bending.

When it is assumed that an overall thickness of the panel assembly 20, including a polarizing plate (not shown), is 0.56 mm, and the impact absorption member 52 is omitted, the bezel 410 is designed to have a width W of about 1.05 mm, and a thickness T of about 0.74 mm. However, the width W and thickness T of the bezel 410 are not so limited, and may vary in accordance with the size and thickness of the panel assembly 20.

The bezel 410 may be formed of a high strength metal, such as stainless steel, cold drawn steel, aluminum, an aluminum alloy, a magnesium alloy, a nickel alloy, and the like. The aluminum alloy and the magnesium alloy are lightweight materials, and they can be used to reduce an overall weight of the OLED display 100.

As the bezel 410 is formed in a frame shape, and has a thickness greater than the panel assembly 20, the strength of the bezel 410 can be enhanced, and thus, the deformations of the bezel 410 can be reduced. Further, since the inner perimeter of the bezel 410 is spaced apart from the outer perimeter of the panel assembly 20, by the gap G, the deformation of the bezel 410 does not directly affect the panel assembly 20, and thus, the panel assembly 20 can be further protected.

Figure 6:
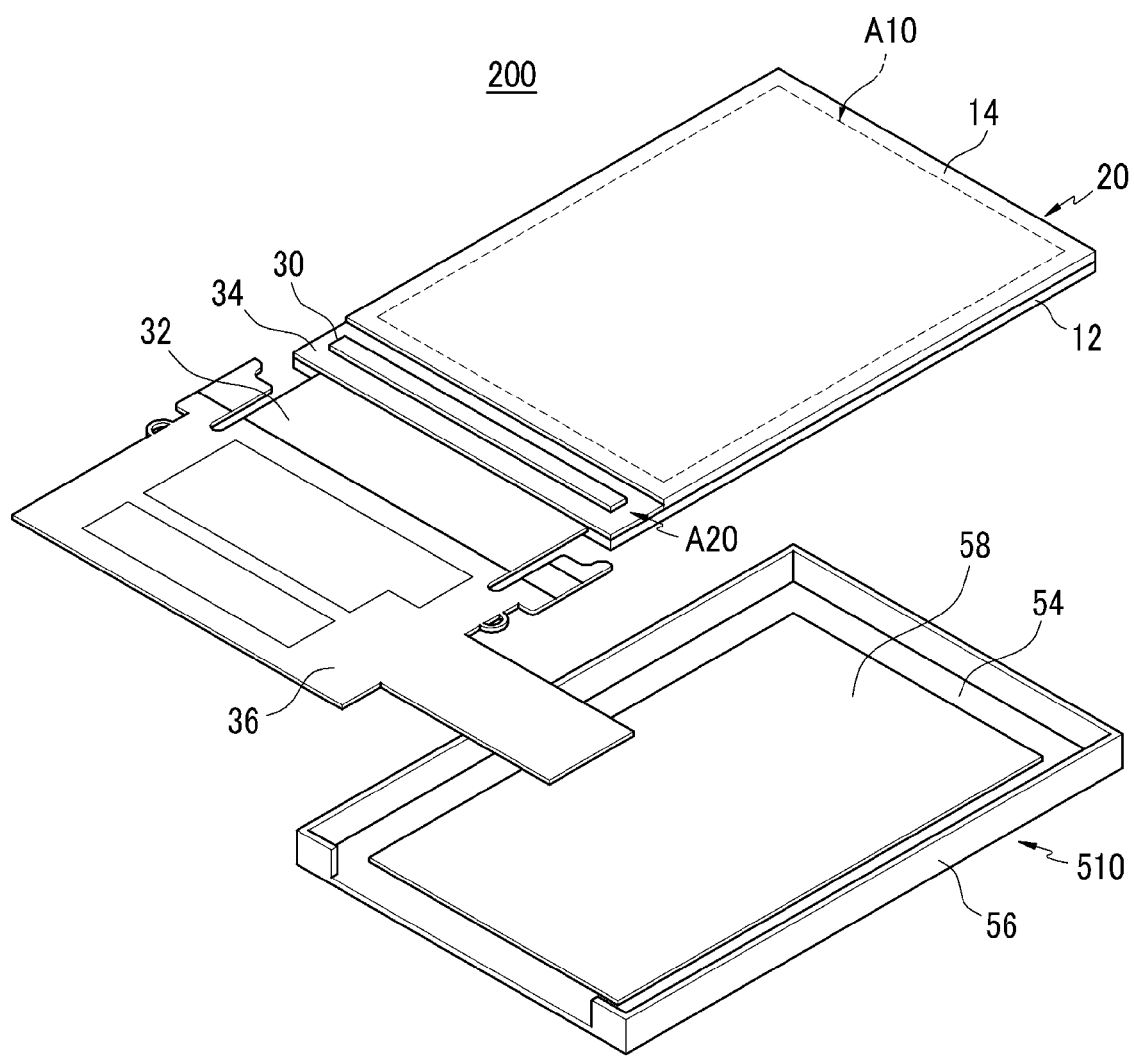
FIG. 6 is an exploded perspective view of an OLED display of a comparative example.
Figure 7:
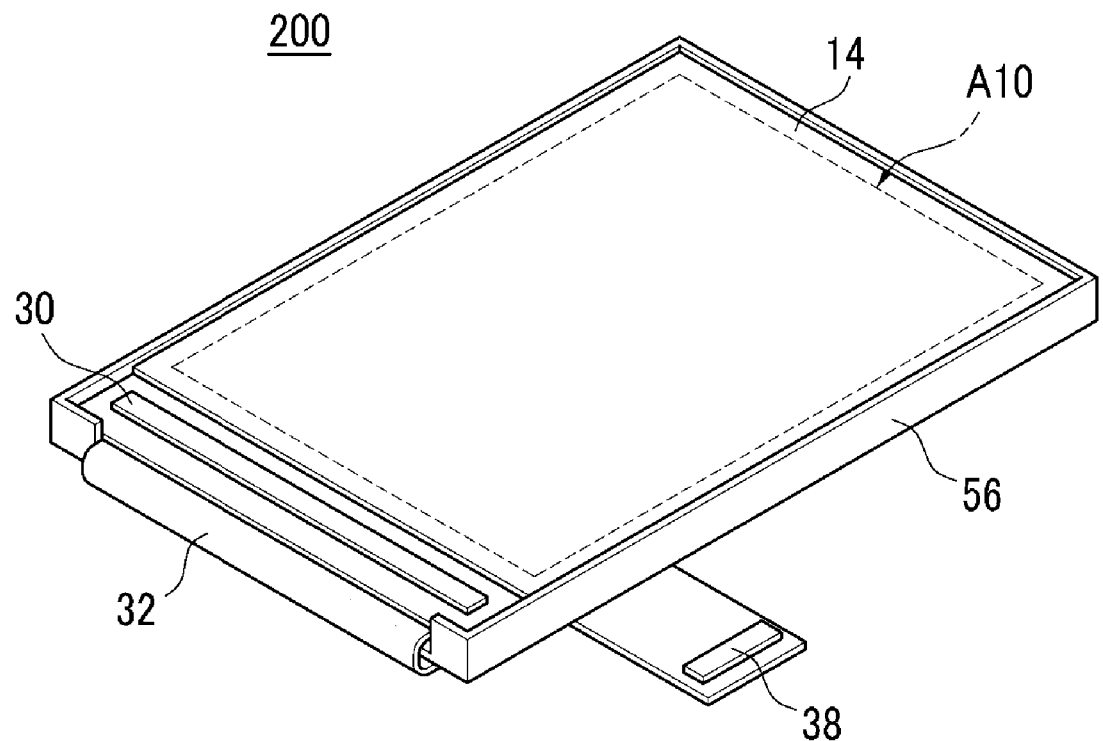
FIG. 7 is an assembled perspective view of the OLED display of FIG. 6.

12 Comparative Examples, each including a conventional bezel, and an associated a panel assembly having a display region whose a diagonal length is 55.88 mm (2.2 inches), were prepared. FIGS. 6 and 7 show a conventional OLED display 200, which is used as a comparative example. The OLED display 200 includes a bezel 510 having a bottom portion 54 on which a panel assembly 20 is disposed, and sidewalls 56 extending from side edges of the bottom portion 54, except for a side edge at which an FPCB 32 is bent toward the panel assembly 20. A double-sided adhesive tape 58 is located between the bottom portion 54 of the bezel 510 and the panel assembly 20, to fix the panel assembly 20 on the bezel 510.

In FIGS. 1, 6, and 7, like reference numbers refer to like parts, except for the bezels. In the comparative OLED display 200, the thickness of the panel assembly 20 is 0.41 mm, the thickness of the bottom portion 54 of the bezel 510 is 0.15, the thickness of the double-sided adhesive tape 58 is 0.03, and the thickness of a polarizing plate (not shown), attached on an outer surface of the second substrate 14, is 0.15 mm. Therefore, an overall thickness of the comparative OLED display 200 is 0.74 mm.

Referring again to FIGS. 1-3, 5 test samples of Example 1, each of which was made by associating the bezel 410 without the impact absorption member 52, with the panel assembly 20 having the display region A10, whose diagonal length is 55.88 mm (2.2 inches), were prepared. In addition, 10 test samples of Example 2, each of which is made by varying a width of the bezel of the OLED display of Example 1, were also prepared. Further, 10 test samples of Example 3, each of which was made by associating the bezel 410 having the impact absorption member 52, with the panel assembly 20 having the display region A10, whose diagonal length is 55.88 mm (2.2 inches), were also prepared.

With regard to Examples 1, 2, and 3, the thickness of the panel assembly 20, the thickness of the polarizing plate disposed on the outer surface of the second substrate 14, the thickness of the impact absorption member 52, and the width W and thickness T of the bezel 410, are shown in the following table 1.

TABLE 1

| | Thickness of Panel Assembly (mm) | Thickness of Polarizing plate | Thickness of Impact Absorption Member (mm) | Thickness of Bezel (mm) | Width of Bezel (mm) |
|---|---|---|---|---|---|
| Example 1 | 0.41 | 0.15 | 0 | 0.74 | 1.05 |
| Example 2 | 0.41 | 0.15 | 0 | 0.74 | 2 |
| Example 3 | 0.41 | 0.15 | 0.15 | 0.74 | 1.7 |

A drop test, for determining damage to the panel assembly 20, was performed by allowing a drop jig, with each of the test samples attached thereto, to execute a free-fall from a height of 1.8 m.

Figure 8:
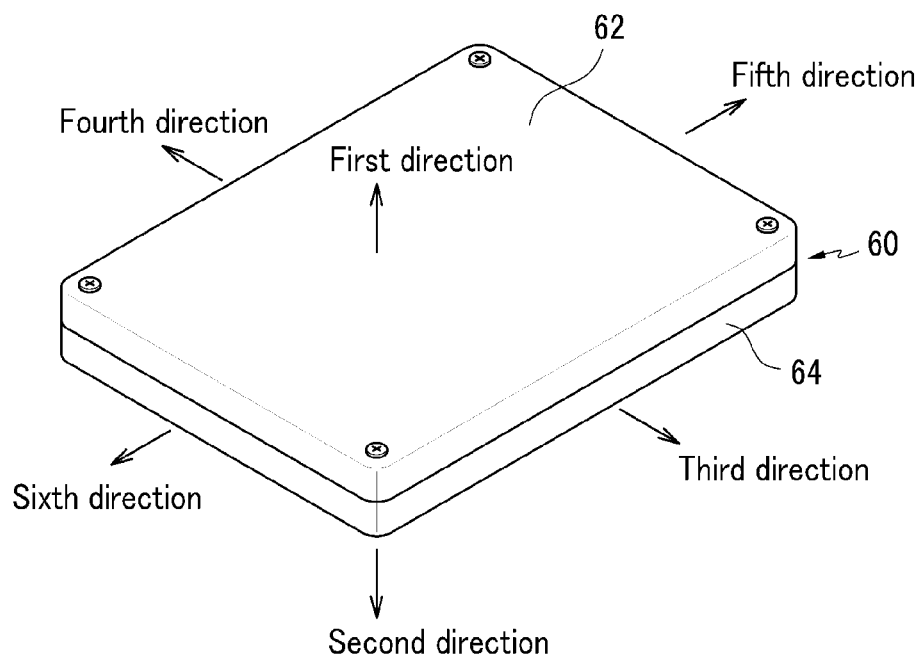
FIG. 8 is a schematic diagram of a drop jig used for a drop test.

FIG. 8 is a schematic diagram of a drop jig 60 used for the drop test. The drop jig 60 includes an upper case 62 and a lower case 64. An OLED display is mounted in a space defined by the upper and lower cases 62 and 64. The drop jig 60 was dropped in the first through sixth directions, as indicated by the arrows. The drop test was performed 18 times (3 times for each of the six directions) for each test sample.

Drop impact resistance points of each test sample, total drop impact resistance points, and average of the drop impact resistance points, of the Comparative Example and Examples 1 to 3, are shown in the following table 2. In the 18 drop tests, the drop impact resistance points were calculated, by giving 1 point when the panel assembly 20 is not damaged, and by giving 0 points when the panel assembly 20 is damaged.

TABLE 2

| | | Drop Impact Resistance Point | | | |
|---|---|---|---|---|---|
| | | Comparative Example | Example 1 | Example 2 | Example 3 |
| Test Samples | 1 | 6 | 6 | 13 | 18 |
| | 2 | 1 | 0 | 18 | 18 |
| | 3 | 1 | 12 | 18 | 18 |
| | 4 | 1 | 13 | 18 | 18 |
| | 5 | 7 | 18 | 18 | 18 |
| | 6 | 13 | — | 1 | 18 |
| | 7 | 13 | — | 6 | 18 |
| | 8 | 7 | — | 16 | 18 |
| | 9 | 1 | — | 1 | — |
| | 10 | 1 | — | 18 | — |
| | 11 | 12 | — | — | — |
| | 12 | 1 | — | — | — |
| Total | | 64 | 49 | 127 | 160 |
| Average | | 5.3 | 9.8 | 12.7 | 16 |

As shown in Table 1, the OLED displays of Examples 1 to 3 have more drop impact resistance points than the OLED displays 200 of the Comparative Example. That is, in the OLED displays 200 of the Comparative Example, the bottom portion 54 of the bezel 510 was easily deformed by the external impacts, and the deformation of the bottom portion 54 directly affected the panel assembly 20. As a result, the panel assembly 20 was easily damaged. On the other hand, in the OLED displays 100 of Examples 1 to 3, since the bottom portion was omitted from the bezel, and the strength of the bezel was enhanced, the damage of the panel assembly was suppressed, as shown in Table 2.

Particularly, it can be noted that the OLED display of Example 3, having the impact absorption member 52, had more drop impact resistance points than the OLED displays of Examples 1 and 2. That is, the OLED display of Example 3 had a higher mechanical strength than the OLED displays of Examples 1 and 2.

Figure 9:
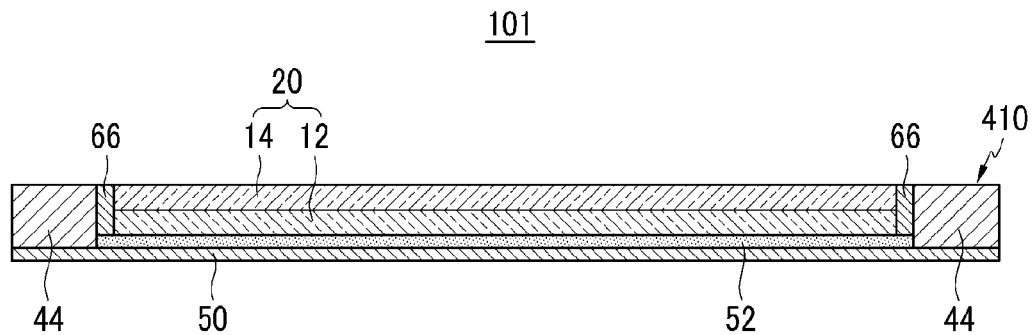
FIG. 9 is a cross-sectional view of an OLED display, according to a second exemplary embodiment of the present disclosure.

FIG. 9 is a cross-sectional view of an OLED display 101, according to a second exemplary embodiment of the present disclosure. Referring to FIG. 9, the OLED display 101 is similar to the OLED display 100, except that a filler 66 is located between a panel assembly 20 and a bezel 410. In the first and second exemplary embodiments, like reference numbers are used to refer to like parts.

The filler 66 is formed of a material having high impact-resistance and flexibility. For example, the filler 66 may be formed of an epoxy resin. The filler 66 increases the fixing force applied to the panel assembly 20, and attenuates impacts transferred from the bezel 410 to the panel assembly 20, thereby protecting the panel assembly 20.

Figure 10:
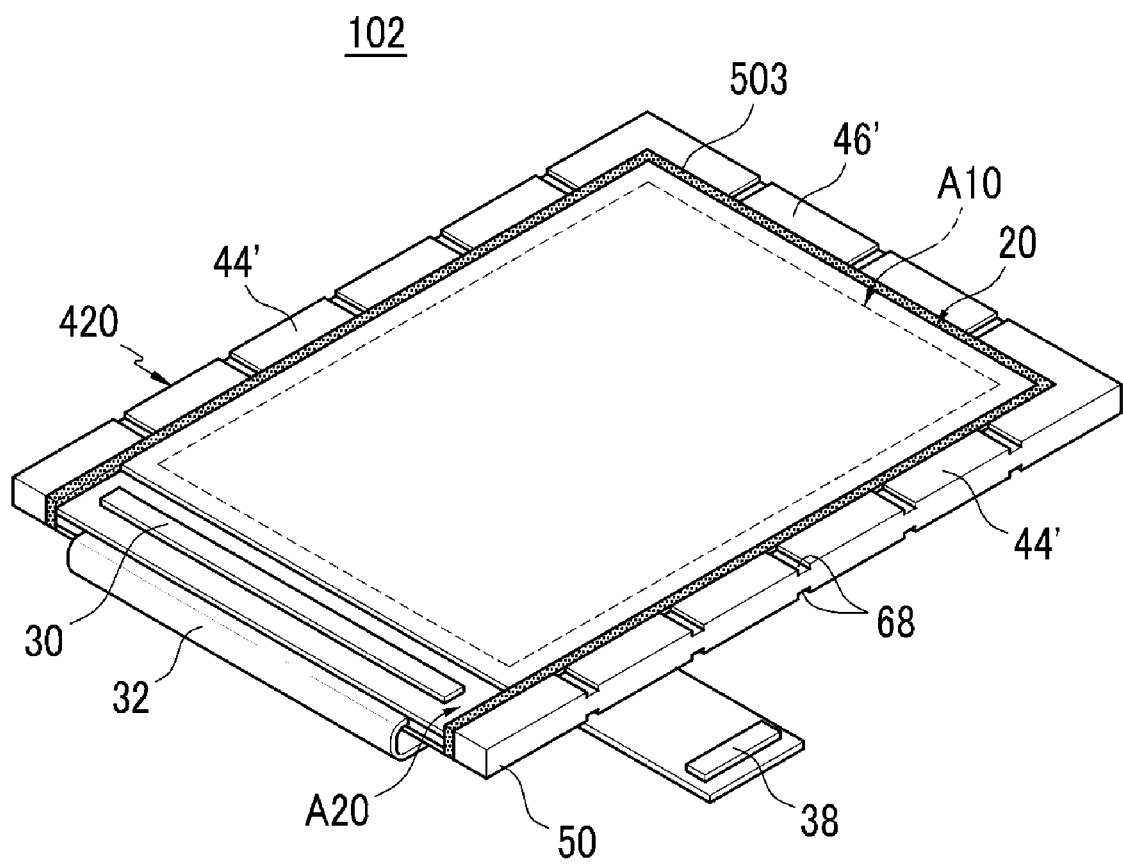
FIG. 10 is an OLED display, according to a third exemplary embodiment of the present disclosure.
Figure 11:
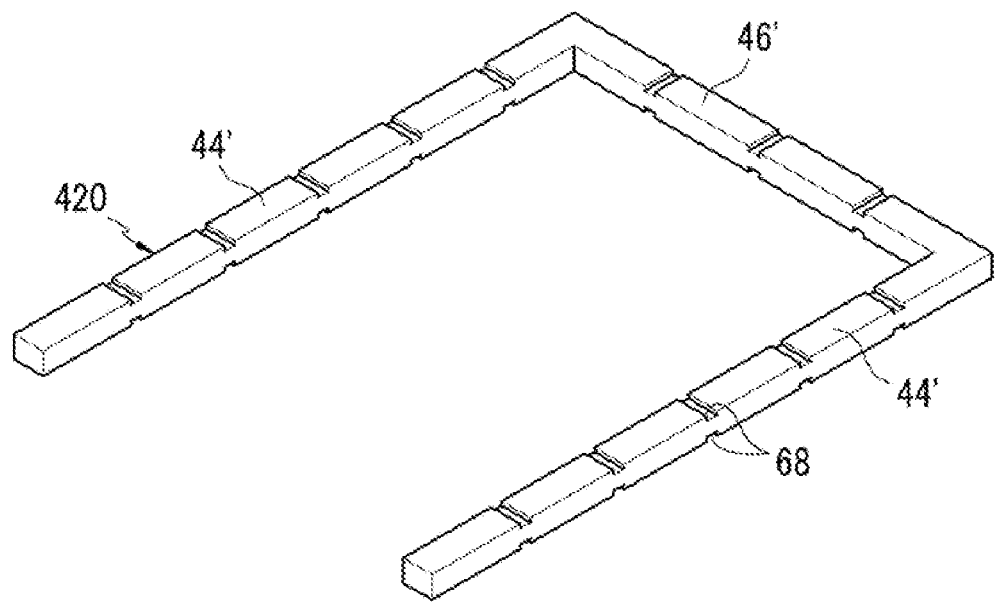
FIG. 11 is a perspective view of a bezel of the OLED display of FIG. 10.

FIG. 10 is an OLED display 102, according to a third exemplary embodiment of the present disclosure, and FIG. 11 is a perspective view of a bezel 420 depicted in FIG. 10. Referring to FIGS. 10 and 11, the OLED display 102 includes a panel assembly 20, the bezel 420, and a fixing member 503 disposed between the panel assembly 20 and the bezel 420. The fixing member 503 may be formed of an epoxy resin having a high viscosity, a high flexibility, and a high impact-resistance. One short side portion of the bezel 420, which corresponds to a pad region A20, is omitted. That is, the bezel 420 includes a pair of long side portions 44' and one short side portion 46'.

The bezel 420 is formed to have a high flexibility. For example, the bezel 420 may be formed of a synthetic resin, rather than a metal. The bezel 420 has a plurality of grooves 68 on top and bottom surfaces thereof, to reduce the thickness/weight of the bezel 420 at various locations.

The OLED display 102 is similar to the OLED display 100, except a fixing member 503 and a bezel 420 are modified. Like reference numbers are used to refer to like parts.

Generally, panel assemblies are manufactured by simultaneously forming a plurality of panel assemblies on a mother substrate, and cutting the mother substrate in units corresponding to the panel assemblies. At this point, fine cracks may be formed on side surfaces of the panel assembly 20, as a cutting wheel passes through the mother substrate. External impacts are generally transferred to the panel assembly 20, through the side surfaces of the panel assembly 20. Therefore, damage to the panel assembly 20 begins at the side surfaces.

In the OLED display 102, the bezel 420 is located around the outer perimeter of the panel assembly 20, the mechanical strength of the side surfaces (the outer perimeter) of the panel assembly 20 is enhanced, and the resistance to bending force is increased, thereby effectively protecting the panel assembly 20 from external impacts. The panel assembly 20 can be protected from damage that can occur during mounting of the OLED display 102 on an electronic device, or when conveying the OLED display 102. Thus, the quality of products incorporating the OLED display 102 can be improved.

Figure 12:
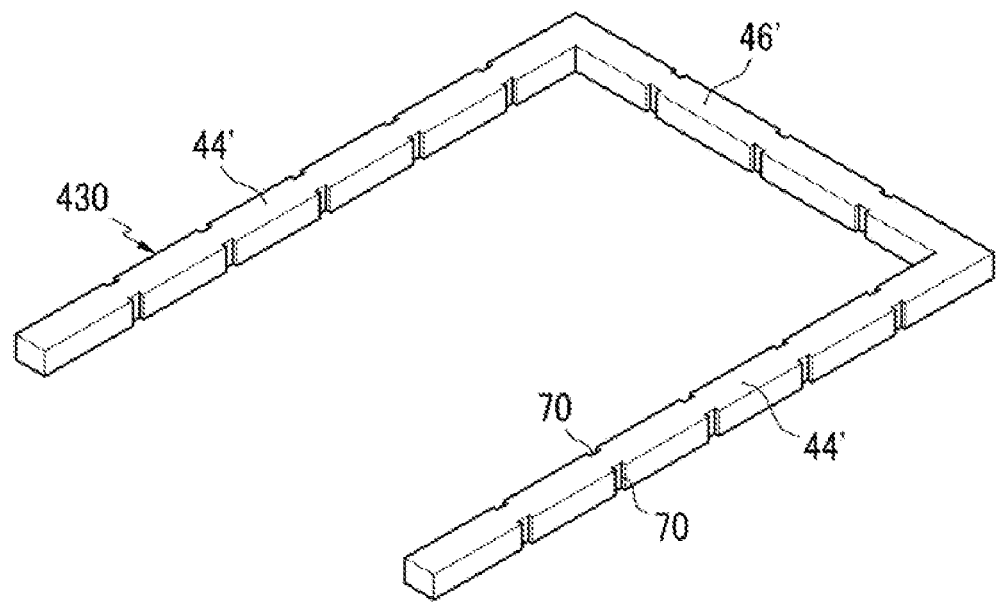
FIG. 12 is a perspective view of a modified example of the bezel of FIG. 11.

FIG. 12 is a perspective view of a modified example of a bezel 430 of the third exemplary embodiment. The bezel 430 is similar to the bezel 420 of the third exemplary embodiment, except that a plurality of grooves 70 are formed on inner and outer side surfaces of a bezel 430, to partly reduce a width/weight of the bezel 430.

Figure 13:
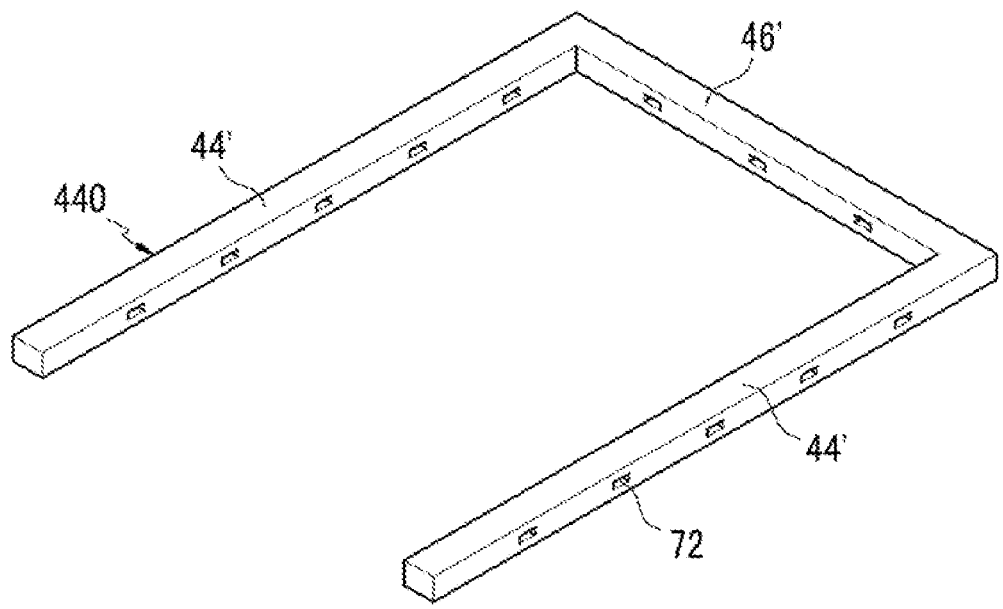
FIG. 13 is a perspective view of another modified example of the bezel of FIG. 11.

FIG. 13 is a perspective view of another modified example of a bezel 440 of the third exemplary embodiment. The bezel 440 is similar to the bezel 420 of the third exemplary embodiment, except that a plurality of holes 72 are formed on inner and outer side surfaces of a bezel 440.

Figure 14:
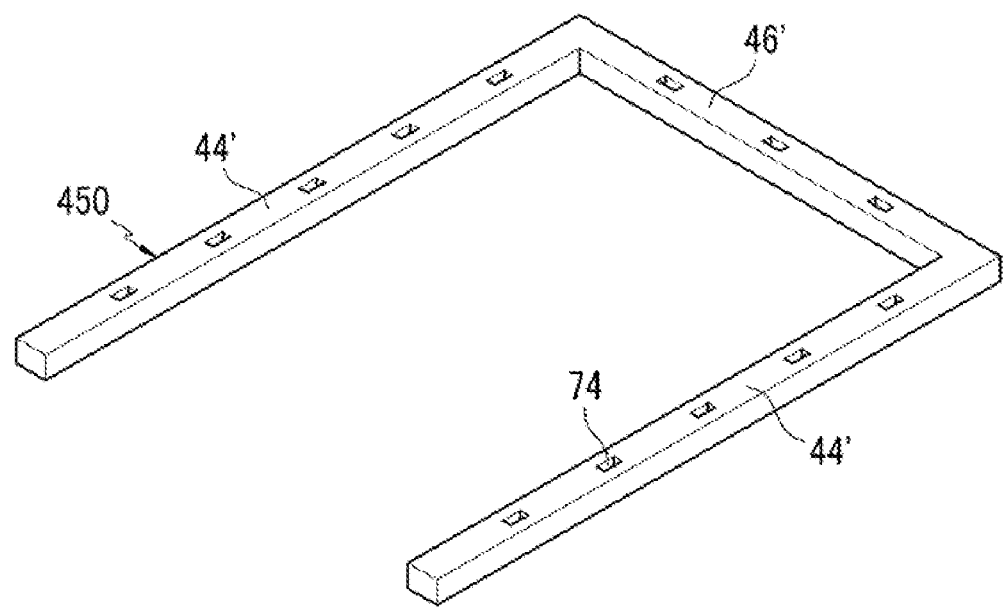
FIG. 14 is a perspective view of still another modified example of the bezel of FIG. 11.

FIG. 14 is a perspective view of another modified example of a bezel 450 of the third exemplary embodiment. The bezel 450 is similar to the bezel 420 of the third exemplary embodiment, except that a plurality of holes 74 are formed in front and rear surfaces of a bezel 450.

Although a few exemplary embodiments of the present invention have been shown and described, it would be appreciated by those skilled in the art that changes may be made in these exemplary embodiments, without departing from the principles and spirit of the invention, the scope of which is defined in the claims and their equivalents.

What is claimed is:

1. An organic light emitting diode (OLED) display comprising:
    a panel assembly comprising a display region, a pad region, and a plurality of OLEDs formed in the display region;
    a bezel disposed around the panel assembly; and
    a fixing member to fix the panel assembly to the bezel,
    wherein the panel assembly is spaced apart from the bezel, and
    wherein the fixing member is disposed on a rear surface of the panel assembly and on a rear surface of the bezel which faces a same direction as the rear surface of the panel assembly.

2. The OLED display of claim 1, wherein the fixing member comprises a base layer and an adhesive layer formed on a surface of the base layer, the adhesive layer facing the panel assembly and the bezel.

3. The OLED display of claim 1, wherein the bezel has a pair of long side portions, and a pair of short side portions, and the long and short side portions defining an opening, and one of the short side portions, which corresponds to the pad region, has a recess portion.

4. The OLED display of claim 3, further comprising:
a flexible printed circuit board fixed on the pad region, and bent toward a rear surface of the fixing member, around the recess portion; and
a printed circuit board electrically connected to the flexible printed circuit board.

5. The OLED display of claim 3, wherein the opening extends all the way through the bezel.

6. The OLED display of claim 1, further comprising an impact absorption member disposed between the panel assembly and the fixing member.

7. The OLED display of claim 6, wherein the impact absorption member comprises an impact absorption layer and an adhesive layer formed on a surface of the impact absorption layer, which faces the panel assembly,
wherein the impact absorption layer is formed of a sponge material or a urethane material.

8. The OLED display of claim 6, wherein the impact absorption member extends into a space between the bezel and the panel assembly.

9. The OLED display of claim 6, wherein the impact absorption member covers an entirety of a surface of the panel assembly facing the fixing member.

10. The OLED display of claim 1, wherein a front surface of the bezel is in the same plane as, or is disposed in front of, a front surface of the panel assembly.

11. The OLED display of claim 1, wherein the width of the bezel is greater than the thickness of the bezel.

12. The OLED display of claim 1, further comprising a filler disposed in a space between edges of the panel assembly and the bezel.

13. The OLED display of claim 1, wherein the bezel is formed of one of stainless steel, cold drawn steel, aluminum, an aluminum alloy, a magnesium alloy, and a nickel alloy.

14. The OLED display of claim 1, wherein the bezel is disposed around four edges of the panel assembly.

15. The OLED display of claim 14, wherein the bezel is disposed around three edges of the panel assembly, and is not disposed around an edge of the panel assembly that is adjacent to the pad region.

16. The OLED display of claim 15, wherein grooves are formed on a front surface and a rear surface of the bezel along the three edges of the panel assembly that are not adjacent to the pad region.

17. The OLED display of claim 15, wherein grooves are formed on inner and outer side surfaces of the bezel along the three edges of the panel assembly that are not adjacent to the pad region.

18. The OLED display of claim 15, wherein holes are formed in front and rear surfaces of the bezel along the three edges of the panel assembly that are not adjacent to the pad region.

19. The OLED display of claim 15, wherein holes are formed in inner and outer side surfaces of the bezel along the three edges of the panel assembly that are not adjacent to the pad region.

20. The OLED display of claim 15, wherein the bezel is formed of a synthetic resin.

21. An organic light emitting diode (OLED) display comprising:
a panel assembly comprising a display region, a pad region, and a plurality of OLEDs formed in the display region;
a bezel having an opening into which the panel assembly is disposed; and
a fixing member disposed on a rear surface of the bezel and a rear surface of the panel assembly which faces a same direction as the rear surface of the bezel, to fix the panel assembly to the bezel.

22. The OLED display of claim 21, wherein edges of the panel assembly are spaced apart from the bezel.

23. The OLED display of claim 21, further comprising a filler disposed between the panel assembly and the bezel.

24. The OLED display of claim 21, wherein the bezel extends around three sides of the panel assembly.

25. The OLED display of claim 21, wherein grooves are formed in at least one surface of the bezel.

26. The OLED display of claim 21, further comprising an impact absorption member disposed between the panel assembly and the fixing member.

* * * * *